(12) United States Patent
Suh

(10) Patent No.: US 6,914,844 B2
(45) Date of Patent: Jul. 5, 2005

(54) DEEP POWER DOWN SWITCH FOR MEMORY DEVICE

(75) Inventor: Jungwon Suh, Apex, NC (US)

(73) Assignee: Infineon Technologies North America Corp., San Jose, CA (US)

(*) Notice: Subject to any disclaimer, the term of this patent is extended or adjusted under 35 U.S.C. 154(b) by 267 days.

(21) Appl. No.: 10/378,472

(22) Filed: Mar. 3, 2003

(65) Prior Publication Data

US 2004/0174762 A1 Sep. 9, 2004

(51) Int. Cl.[7] .............................................. G11C 7/00
(52) U.S. Cl. .................. 365/227; 365/189.02; 365/229
(58) Field of Search ........................... 365/227, 189.02, 365/229

(56) References Cited

U.S. PATENT DOCUMENTS 6,714,047 B2 * 3/2004 Shimizu et al. ............... 326/62
2004/0001386 A1 * 1/2004 Park ............................. 365/227

* cited by examiner

*Primary Examiner*—Huan Hoang
(74) *Attorney, Agent, or Firm*—Darby & Darby

(57) ABSTRACT

A circuit to operate a semiconductor integrated circuit memory device having memory cells in a deep power down mode. The power down circuit includes a transistor switch connected between an external voltage source and the device memory cells and peripheral circuits, a generator for providing a control voltage of a first level different from the value of the external voltage, and a multiplexer that receives as one input the control voltage and as a second input the external voltage. The multiplexer has a selected output of one of the control voltage and external voltage that is applied to a control electrode of the transistor switch. When deep power down mode operation is required, the multiplexer responds to a power down control flag signal to apply the external voltage to the transistor control electrode to turn off the transistor and block application of the external voltage to the memory cells and peripheral circuits. In normal operation, no power down control flag signal is produced and the multiplexer applies the control voltage of a first level to the transistor switch control electrode to cause the transistor to conduct and apply the external voltage to the device memory cells and peripheral circuits for normal operation.

6 Claims, 2 Drawing Sheets

DEEP POWER DOWN SWITCH FOR MEMORY DEVICE

FIELD OF THE INVENTION

The present invention relates to a circuit for operating synchronous DRAM, psuedo-SRAM and other memory devices in a deep power down mode.

BACKGROUND OF THE INVENTION

Synchronous DRAM and other types of semiconductor integrated circuit memory devices, or chips, used in mobile applications, such as laptop computers and hand-held devices, operate from a low level external voltage (Vext) supply, e.g., 1.8 volts or less. The Vext is typically supplied by a battery. The memory devices have memory cells and peripheral circuits, such as bank selectors, various registers, etc.

The memory chip often includes a voltage down converter which converts the Vext voltage to a lower value of internal voltage Vint that is used to power the memory cells and peripheral circuits of the device. Depending on performance requirements for the device peripheral circuits, the voltage down converter can be used only for the memory cells, or not used at all. When the chip has no voltage down converter, the external voltage Vext can be used directly as a power supply for the peripheral circuits, or both the memory cells and the peripheral circuits.

When the computer or hand-held device is in a standby mode, the memory devices are operated in a power down mode or deep power down mode (DPDM) to reduce the consumption of standby current drain from the battery as much as possible. The power down mode is different from the DPDM deep power down mode. Typically, the power down mode requires that the chip draw, for example, only several hundred μA current (for example, 500 μA) from the power supply. The deep power down mode DPDM has a more stringent current draw specification of, for example, only several μA (for example, 2 μA). In practical applications, when operating in the power down mode, all memory cells of the device retain the data. When operating in the DPDM, all memory cells lose the data.

One type of conventional circuit used to place the memory device in a DPDM uses a part of the voltage down converter circuit on the chip. This circuit uses the voltage down converter switching transistor, called a pull-up transistor, which receives the external supply voltage Vext as an input and outputs the lower value internal voltage Vint. When the memory device is in a deep power down mode the voltage down converter is shut down for both memory cells and peripheral circuits in order to suppress all leakage current through the memory cell transistors and the peripheral circuits.

One current trend in designing memory devices is to have them operate at lower values of supply voltage Vext in order to reduce the size of the external voltage supply source, which is usually a battery. But, in most synchronous DRAM and other types of memory devices that operate from an external power supply of a very low voltage level, a voltage down converter cannot be used to shut off the device peripheral circuits because of circuit performance requirements. This is mainly due to the limitation of the performance of the transistors of the peripheral circuits under a very low value of operating voltage, which occurs due to the lower values of Vext. That is, if there is a low value operating voltage, the transistors in the chip peripheral circuits operate slowly. This is because the transistors of a memory chip have a low current driving capability when operating under a low value supply voltage and therefore operate slowly.

For example, assume that Vext=1.8V and that all transistors of the device, such as those used for the memory cells and peripheral circuits, are optimized to operate at a voltage of Vint=1.8V. In this example, a voltage down converter cannot be used because Vint=Vext=1.8V and Vint can never be regulated. To generate a stable Vint for all operation times, Vint must be less than the Vext=1.8V, for example, Vint=1.4V. From a design point of view, in the example being described, a value of Vext=1.8V should be adopted as the value of the power supply voltage for the device transistors instead of the lower value voltage Vint of 1.4V.

If a voltage down converter is used to supply the Vint operating voltage for the peripheral circuits and memory cells in the device, then the pull up transistor of the converter would determine the allowable leakage current in the device. For example, consider that the pull up transistor is of the PMOS type and has a channel width of ~10000 μm. But the summation of the channel widths of the device PMOS transistors of the peripheral circuits through which the leakage current flows may be >100000 μm, without the voltage down converter. Therefore, the total leakage current is ten times as large as the design with the voltage down converter and its pull up transistor.

Without a switch like the pull up transistor of a voltage down converter, it is difficult to suppress the leakage current to satisfy the current specification for a device that operates in the deep power down mode DPDM where the current drain is to be only several μA. To explain this, consider that the total leakage current in the device is proportional to the summation of the channel width of all of the device transistors. It is practically impossible to control the total channel width of all of the transistors in the memory device. Therefore, a switch is needed between the external voltage Vext and the chip peripheral circuits, or both the peripheral circuits and the memory cells, to control the leakage current of the chip transistors when the chip is in the DPDM. This switch is different from a pull up transistor of a voltage down converter in that such switch will connect Vext as the internal power of the peripheral circuits and memory cells. Because there is no voltage down converter, it cannot regulate Vint. That is, Vext=Vint.

SUMMARY OF THE INVENTION

The present invention provides a new switch arrangement to implement deep power down mode DPDM operation in synchronous DRAM and other types of memory devices that are operated from a low value Vext voltage. The invention provides a circuit that is integrated on a memory device chip that operates when the device is to be in a deep power down mode DPDM to reduce the consumption of power from the external source. The circuit of the invention, which is preferably implemented on the chip, includes a generator that produces a voltage of a value Vn that is supplied to one input of a multiplexer. The multiplexer also receives the external voltage of value Vext as a second input. The output voltage of the multiplexer, hereafter called PC, selectively can be either of the value Vn or Vext. The multiplexer output voltage PC is applied to the gate node of a switching transistor connected between the Vext supply and the peripheral circuits and memory cell of the chip. The output of the switching transistor is the voltage Vint that is used to supply operating voltage to at least the chip peripheral circuits.

A DPDM flag signal is produced by an external source and the flag signal is supplied to both the voltage generator and the multiplexer when the memory chip is to be operated in the DPDM mode. In normal operation, no DPDM flag signal is present and the output PC of the multiplexer is the voltage Vn. The value of voltage Vn is such as to turn on the switching transistor making it conductive to connect its supply voltage Vext as the Vint voltage for the chip. In a preferred embodiment of the invention the switching transistor is of the PMOS type and voltage Vn has a negative polarity. When DPDM operation is required for the chip, the DPDM flag signal applied to the multiplexer operates it to apply the Vext voltage to the switching transistor gate node. The value of Vext turns the switching transistor off and thereby prevents the memory cells and chip peripheral circuits from drawing current thereby achieving the deep power down current specification. The DPDM flag signal applied to the voltage generator turns off the generator so that it does not consume any power during DPDM operation of the chip.

BRIEF DESCRIPTION OF THE DRAWINGS

Other objects and advantages of the present invention will become more apparent upon reference to the following specification and annexed drawings, in which.

DETAILED DESCRIPTION OF THE INVENTION

Figure 1:
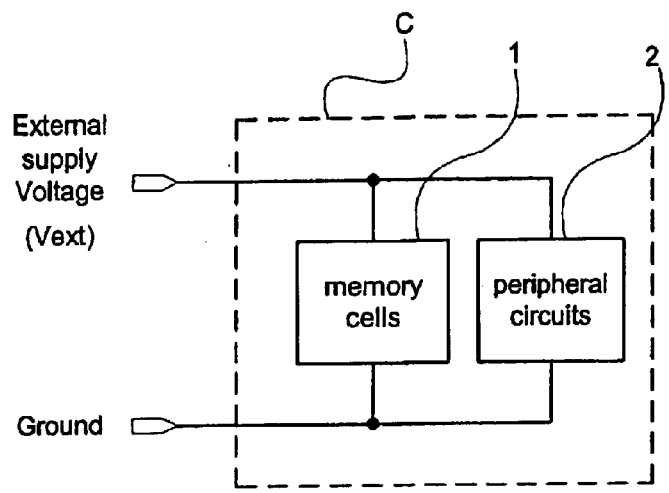
FIG. 1 is a schematic diagram of a conventional power supply scheme for the memory cells 1 and the peripheral circuits 2 of a memory device.

FIG. 1 shows a conventional power scheme in which the memory cells 1 and peripheral circuits 2 of the integrated circuit memory device, or chip, C are powered directly by the external voltage Vext. The circuit of FIG. 1 does not have any switch to suppress leakage currents in the transistors of the memory cells 1 and peripheral circuits 2 of the device during a deep power down mode. Considering the circuit of FIG. 1, the simplest way to control the leakage current in the device when it is to be operated in a deep power down mode is to insert a switch transistor between Vext and the internal circuitry (memory cells 1 and peripheral circuits 2). Such a switch is not a pull up transistor of a voltage down converter because no voltage down converter is in the device. But because synchronous DRAM and other memory devices used in mobile applications operate from an external source of very low value external voltage level Vext, a relatively large size transistor would be needed as a switch to avoid a large voltage drop across its channel resistance.

To explain this, as is known, the channel resistance of a transistor switch is inversely proportional to the transistor channel width. The transistor channel resistance directly affects the level of the internal voltage Vint that the switch connects with Vext. In the circuit of FIG. 1 Vint=Vext and Vint is not a regulated internal voltage. Therefore, it would be desirable to keep the transistor channel resistance as small as possible. The switch transistor normally is operated in its linear region. Therefore, there are two methods available to make the transistor channel resistance small. The first is to increase the transistor channel width. The second is to increase the transistor gate-source voltage. The first method is not a good solution in actual chip design because the required channel width is too large to implement from a practical point of view. Providing a transistor that occupies too large an area of chip is not realistic in memory chip design where the object is to reduce chip size. The second method would require an increase in the value of the external supply voltage, which is not acceptable.

Figure 2:
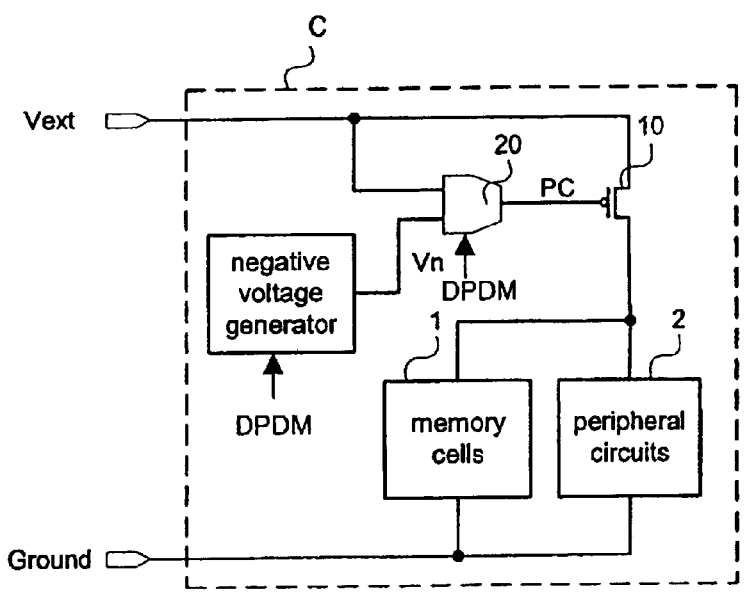
FIG. 2 is a schematic diagram of a deep power down mode switch in accordance with the invention.

FIG. 2 illustrates the circuit of the present invention. All of the components are integrated on the memory device chip C by conventional fabrication techniques. The circuit has a voltage generator 30 of any suitable conventional construction that operates from the external voltage supply of voltage of value Vext, of positive polarity in the example being described, and produces a voltage output of value Vn. In the illustrative embodiment of the invention being described, the voltage Vn is of negative polarity. The polarity of the various voltages is selected in accordance with the types of transistors used on the chip.

The output Vn of the generator 30 is applied as one input to a multiplexer type logic circuit 20 of suitable conventional construction. The external supply voltage Vext is applied as another input to the multiplexer 20. The output voltage (PC) of the multiplexer 20 is applied to the gate electrode of a switching transistor 10 that is illustratively of the PMOS type. The transistor 10 source electrode receives the Vext voltage. The transistor drain electrode provides the output voltage Vint that is applied to the memory cells 1 and the peripheral circuits 2 of the chip.

Both the negative voltage generator 30 and the multiplexer 20 receive a DPDM flag signal from an external source when the chip is to be operated in the reduced power consumption DPDM mode. Usually, the DPDM flag signal is generated by an external command. For example, in memory devices such as DRAM chips, DPDM entry and exit command timings usually are defined in the memory chip specification. Operation of the multiplexer 20 in response to the DPDM flag signal controls whether the gate node of transistor switch 10 receives the voltage of value Vn or of value Vext. That is, during normal operation of the chip there is no DPDM flag signal and the multipexer 20 outputs the negative voltage of value Vn from the generator 30 to the gate node of the switching transistor 10. When the PMOS transistor switch 10 receives the negative gate voltage Vn, it turns on, i.e., Vpc=Vn, and the external voltage Vext is applied through the switch 10 to the chip memory cells and the peripheral circuits. The memory chip is now in the normal operating mode. Also, during normal operation of the chip when there is no DPDM flag signal, the negative voltage generator 30 continues to operate to produce the negative output voltage Vn which is applied to multiplexer 20.

When the chip is to be operated in the deep power down mode, the DPDM flag signal is present. When the DPDM flag signal is applied to the multiplexer 20, the multiplexer passes the output voltage (PC) of value Vext to the gate node of transistor switch 10 and the switch is turned off. When the switch 10 is off, the Vext supply voltage is removed from the device memory cells 1 and peripheral circuits 2. Therefore, the total leakage current is determined by the switch. Also, the DPDM flag signal is applied to the voltage generator 30 and turns off the generator. Therefore, the voltage generator does not consume any power during DPDM operation of the chip.

Figure 3:
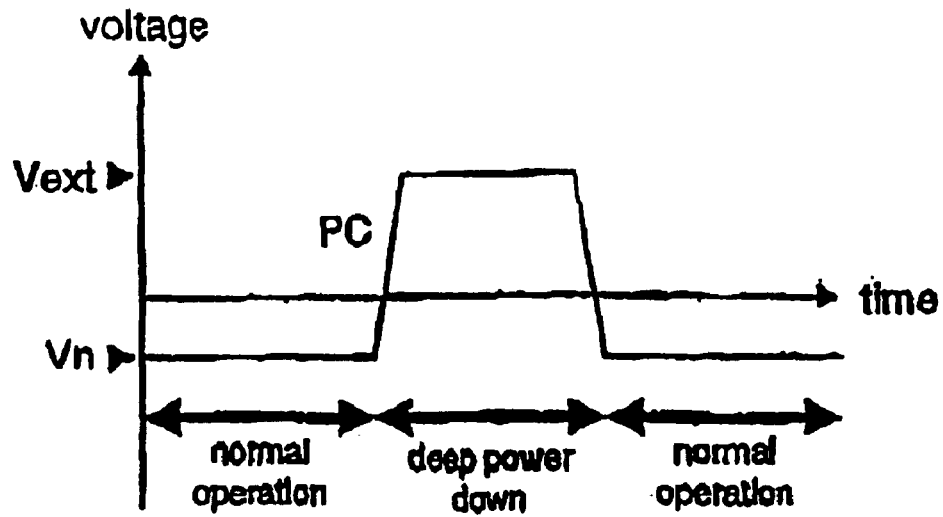
FIG. 3 is a control timing diagram for the switch of the present invention.

FIG. 3 is a timing diagram that illustrates the operation of the circuit. In normal operation of the chip, the multiplexer 20 produces the PC negative polarity output voltage of value Vn that is applied to the gate electrode of the transistor switch 10. This causes the transistor to conduct and apply the supply voltage Vext to the chip memory cells and peripheral circuits. When the DPDM flag signal is generated to place the chip in the DPDM operation mode, the output PC of the multiplexer 20 becomes positive to the value of the voltage Vext. This causes the transistor switch 10 to turn off and no voltage is applied to the memory cells and peripheral circuits. The circuit remains in the DPDM mode until generation of the DPDM flag signal is terminated. At this time, the Vn voltage is applied to the transistor switch 10 which conducts and the chip resumes normal operation.

By using a negative voltage Vn to control operation of the transistor switch 10, the transistor can be implemented with reasonable size on a chip. This is because gate-source voltage is /Vn/+Vext so that the switching transistor can have a low value channel resistance without a large channel width. This is an issue of engineering trade-off between channel width and the level of the negative voltage Vn. A smaller size transistor switch is better for reducing leakage current during DPDM operation. This is because the total leakage current through the switch in the device is proportional to channel width of the switching transistor. A smaller size transistor having a smaller channel width acts more favorably in suppressing the leakage current during DPDM. But, too small a channel width possibly could cause problems during normal operation of the switch, i.e., a large voltage drop across the switch channel can occur and the peripheral circuits might experience performance degradation. From a threshold point of view, the value of Vint should be as close as possible to that of Vext, but Vint is less than Vext due to the channel resistance of the switch.

Figure 4:
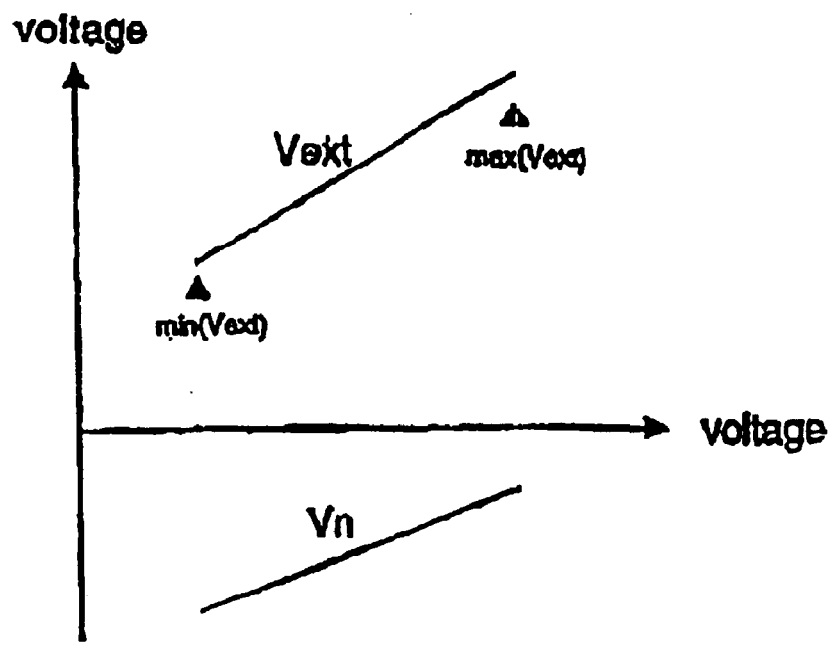
FIG. 4 shows the tracking of the value of voltage from the voltage generator as the value of the external voltage changes.

Generally, the value of the negative voltage Vn should track Vext variation in order to obtain adequate driving capability for the PMOS transistor switch 10. That is, as the value of the supply voltage Vext for the PMOS transistor becomes lower, the value of the voltage applied to the transistor gate electrode must be more negative to keep the same current driving capability. The gate-source voltage is /Vn/+Vext. If the value of Vext becomes lower, then Vn must be more negative to have the same gate-source voltage for the switching transistor. This is shown in FIG. 4. However, the transistor may encounter a reliability problem at maximum value of Vext if the negative voltage Vn has the same voltage level that it had at the minimum value of Vext.

In the preferred embodiment of the invention, the negative voltage generator 30 is powered by the external voltage Vext. As illustrated in FIG. 4, the negative voltage generator preferably is configured so that the negative voltage Vn that the generator 30 produces linearly tracks the external voltage Vext. That is, the value of Vn increases (becomes more positive) as the value of the external voltage Vext increases (becomes more positive). A negative voltage Vn output for generator 30 that linearly tracks Vext is more desirable to meet the reliability issue of the transistor switch at maximum external voltage Vext is preferred to ensure that the transistor switch 10 operates properly. Any conventional design can be used for implementing the negative voltage generator to produce a negative voltage Vn that linearly tracks external voltage Vext changes.

While the circuit of the invention is shown using a PMOS switching transistor the type of transistor and other circuits can be changed upon suitable choice of the correct polarity voltages for Vext and Vn.

Specific features of the invention are shown in one or more of the drawings for convenience only, as each feature may be combined with other features in accordance with the invention. Alternative embodiments will be recognized by those skilled in the art and are intended to be included within the scope of the claims.

I claim:

1. A power down circuit for a semiconductor integrated circuit memory device operating from an external voltage source and having memory cells and peripheral circuits comprising:

a transistor switch connected between the external voltage source and the memory cells and peripheral circuits;

a generator for providing a control voltage of a first level different from the external voltage;

a multiplexer receiving as one input said control voltage and as a second input the external voltage, said multiplexer having a selected output of one of said control voltage and said external voltage that is applied to a control electrode of said transistor switch;

wherein said multiplexer is responsive to a power down control signal to selectively apply the external voltage to said transistor control electrode to block application of the external voltage to the device memory cells and peripheral circuits, and responsive to the absence of the power down control signal to apply said control voltage to said transistor switch control electrode and operate said transistor to apply the external voltage to the device memory cells and peripheral circuits for normal operation of the memory device.

2. A power down circuit for a semiconductor device as claimed in claim 1 wherein said power down control signal is applied to said generator to turn off said generator during the time of the application of said power down control signal.

3. A power down circuit for a semiconductor memory device as claimed in claim 1 wherein said transistor switch is a PMOS transistor and said generator produces a negative voltage as said control voltage.

4. A power down circuit for a semiconductor memory device as claimed in claim 1 wherein said control voltage of linearly tracks changes in the value of said external voltage.

5. A power down circuit for a semiconductor memory device as claimed in claim 4 wherein said transistor switch is a PMOS transistor and said generator produces a negative voltage as said control voltage.

6. A power down circuit for a semiconductor memory device as claimed in claim 5 wherein the value of the control voltage becomes more positive as the value of the external voltage becomes more positive.

* * * * *